US009047937B2

(12) United States Patent
Kang et al.

(10) Patent No.: US 9,047,937 B2
(45) Date of Patent: Jun. 2, 2015

(54) RESISTIVE RANDOM ACCESS MEMORY DEVICE, METHOD FOR MANUFACTURING THE SAME, AND METHOD FOR OPERATING THE SAME

(75) Inventors: Jinfeng Kang, Beijing (CN); Bin Gao, Beijing (CN); Yuansha Chen, Beijing (CN); Bing Sun, Beijing (CN); Lifeng Liu, Beijing (CN); Xiaoyan Liu, Beijing (CN)

(73) Assignee: Peking University (CN)

( * ) Notice: Subject to any disclaimer, the term of this patent is extended or adjusted under 35 U.S.C. 154(b) by 115 days.

(21) Appl. No.: 13/701,626

(22) PCT Filed: May 19, 2011

(86) PCT No.: PCT/CN2011/074319
§ 371 (c)(1),
(2), (4) Date: Jan. 23, 2013

(87) PCT Pub. No.: WO2011/150749
PCT Pub. Date: Dec. 8, 2011

(65) Prior Publication Data
US 2013/0128653 A1 May 23, 2013

(30) Foreign Application Priority Data
Jun. 3, 2010 (CN) .......................... 2010 1 0198033

(51) Int. Cl.
*G11C 11/00* (2006.01)
*G11C 11/36* (2006.01)
(Continued)

(52) U.S. Cl.
CPC ........ *G11C 13/0002* (2013.01); *G11C 13/0007* (2013.01); *G11C 13/003* (2013.01);
(Continued)

(58) Field of Classification Search
USPC .................................. 365/148, 175; 257/734
See application file for complete search history.

(56) References Cited

U.S. PATENT DOCUMENTS 6,013,950 A * 1/2000 Nasby ........................... 257/734
7,408,212 B1 8/2008 Luan et al.
(Continued)

FOREIGN PATENT DOCUMENTS

CN 101711431 A 5/2010

OTHER PUBLICATIONS

"International Application Serial No. PCT/CN2011/074319, International Search Report mailed Aug. 4, 2011", 5 pgs.
(Continued)

*Primary Examiner* — Trong Phan
(74) *Attorney, Agent, or Firm* — Schwegman Lundberg & Woessner, P.A.

(57) ABSTRACT

A resistive random access memory device, a method for manufacturing the resistive random access memory device, and a method for operating the resistive random access memory device are disclosed. The resistive random access memory device includes a resistive switching memory element including two electrodes and a layer of variable-resistance material between the two electrodes, wherein the layer of variable-resistance material exhibits bipolar resistive switching behavior; and a Schottky diode including a metal layer and a p-doped semiconductor layer which contact each other, wherein the metal layer of the Schottky diode is coupled to one of the two electrodes of the resistive switching memory element. The present disclosure provides the resistive random access memory device operating in bipolar resistive switching scheme.

4 Claims, 5 Drawing Sheets

(51) Int. Cl.
  *G11C 13/00*   (2006.01)
  *H01L 27/24*   (2006.01)
  *H01L 45/00*   (2006.01)

(52) U.S. Cl.
  CPC .... *G11C13/0069* (2013.01); *G11C 2013/0073* (2013.01); *G11C 2213/72* (2013.01); *G11C 2213/76* (2013.01); *H01L 27/2409* (2013.01); *H01L 27/2463* (2013.01); *H01L 45/1253* (2013.01); *H01L 45/16* (2013.01); *G11C 2213/15* (2013.01); *H01L 45/1608* (2013.01)

(56) References Cited

U.S. PATENT DOCUMENTS

| | | | |
|---|---|---|---|
| 8,023,312 B2 * | 9/2011 | Yamazaki et al. | 365/148 |
| 8,144,498 B2 | 3/2012 | Kumar et al. | |
| 8,456,900 B2 * | 6/2013 | Lee et al. | 365/148 |
| 8,531,868 B2 * | 9/2013 | Wang et al. | 365/148 |
| 8,750,020 B2 * | 6/2014 | Lu et al. | 365/148 |
| 2006/0054950 A1 | 3/2006 | Baek | |

OTHER PUBLICATIONS

"International Application Serial No. PCT/CN2011/074319, Written Opinion mailed Aug. 4, 2011", 4 pgs.

Zuo, O., et al., "Progress in development of Resistive RAM and its Integration Technology", (w/ English Abstract), *Microelectronics*, 39(4), (Aug. 2009), 546-551.

"Chinese Application Serial No. 201010198033.3, First Office Action mailed Jul. 3, 2012", (w/ English Translation), 9 pgs.

"Chinese Application Serial No. 201010198033.3, Second Office Action mailed Mar. 29, 2013", (w/ English Translation), 7 pgs.

"International Application Serial No. PCT/CN2011/074319, International Preliminary Report on Patentability dated Dec. 4, 2012", 5 pgs.

* cited by examiner

RESISTIVE RANDOM ACCESS MEMORY DEVICE, METHOD FOR MANUFACTURING THE SAME, AND METHOD FOR OPERATING THE SAME

RELATED APPLICATIONS

This application is a National Phase application of, and claims priority to, PCT Application No. PCT/CN2011/074319, filed on May 19, 2011, entitled "RESISTIVE RADOM ACCESS MEMORY DEVICE, METHOD FOR MANUFACTURING THE SAME, AND METHOD FOR OPERATING THE SAME", which application claimed priority to Chinese Application No. 201010198033.3, filed on Jun. 3, 2010, both of which applications are incorporated herein by reference in their entireties.

TECHNICAL FIELD

The present disclosure relates to a memory device, and in particular, to a resistive random access memory device (RRAM).

The present disclosure also relates to a method for manufacturing the resistive random access memory device and a method for operating the resistive random access memory device.

BACKGROUND

Today, advance of microelectronic industry also promotes memory technology to achieve an increased integration level and a reduced manufacture cost. Non-volatile memory devices maintain information data stored therein after power off and play an important role in information storage.

One of novel non-volatile memory devices, called resistive random access memory (RRAM) or resistive switching memory, uses a variable-resistance material and has the advantages of high operation speed (<5 ns), low power dissipation (<1V) and easily being integrated with other semiconductor devices. Such non-volatile memory devices are a prospective candidate for next-generation memory devices. The resistive switching memory device typically has an metal-insulator-metal (MIM) configuration in which a layer of variable-resistance material is sandwiched between two metal electrodes.

The variable-resistance material is typically a transition metal oxide, such as NiO, $TiO_2$, $HfO_2$, $ZrO_2$, ZnO, or the like. The variable-resistance material can have two stable states, i.e. a high-resistance state and a low-resistance sate, which correspond to digital "0" and digital "1" respectively. A change from the high-resistance state to the low-resistance state is referred to as programming or SET operation, and a change from the low-resistance state to the high-resistance state is referred to as erasing or RESET operation.

The resistive switching memory devices can be classified as unipolar or bipolar devices according to its operation scheme. According to the former, a voltage is applied across a resistive switching memory device in one direction, and changes a resistance state of a variable-resistance material between a high-resistance state and a low-resistance with different amplitudes of the voltage to write data into the resistive switching memory device or erase data therefrom. According to the latter, a voltage is applied across the resistive switching memory device in two opposite directions for changing the resistance state of the variable-resistance material respectively. The bipolar resistive switching memory devices are superior to the unipolar resistive switching memory devices in memory performances such as switching speed, uniformity, reliability (data retention and endurance), controllability, or the like.

The resistive switching memory devices can be classified as 1T-1R configuration or 1D-1R configuration according to its basic configuration. Each memory cell in the 1T-1R configuration includes one select transistor and a resistive switching memory cell. By controlling the select transistor, data can be written into a selected memory cell or erased therefrom. Because the select transistor is used, it occupies a major portion of a footprint of the memory cell, which hinders an increase of the integration level. Each memory cell in 1D-1R configuration includes one diode and a resistive switching memory cell. The diode is used to suppress the sneak path current through the memory array. Because the diode typically occupies an area less than a transistor, the memory cell in 1D-1R configuration is advantageous in an increase of the integration level.

However, conventional resistive switching memory devices in 1D-1R configuration can only operate in unipolar resistive switching scheme due to limited material properties of the diode, which in turn limits memory performances.

SUMMARY OF THE DISCLOSURE

One object of the present disclosure is to provide a resistive random access memory device in 1D-1R configuration and operating in bipolar resistive switching scheme.

Another object of the present disclosure is to provide a method for manufacturing the resistive random access memory device and a method for operating the resistive random access memory device.

A Schottky diode including contacted metal and semiconductor exhibits a relatively large reverse current which dependents on a metal material under an external bias. The inventor proposes a series configuration of the Schottky diode and a bipolar resistive switching memory element to provide a resistive random access memory device in 1D-1R configuration and operating in bipolar resistive switching scheme. The Schottky diode has suitable property parameters under a positive voltage and a negative voltage.

Moreover, the disclosure proposes a feasible operation scheme for the above resistive random access memory device in 1D-1R configuration.

According to one aspect of the present disclosure, there is provided a resistive random access memory device, comprising: a resistive switching memory element including two electrodes and a layer of variable-resistance material between the two electrodes, wherein the layer of variable-resistance material exhibits bipolar resistive switching behavior; and a Schottky diode including a metal layer and a p-doped semiconductor layer which contact each other, wherein the metal layer of the Schottky diode is coupled to one of the two electrodes of the resistive switching memory element.

According to another aspect of the present disclosure, there is provided a method for manufacturing the above resistive random access memory device, comprising: forming a polysilicon layer on a substrate; doping the polysilicon layer with dopants to form a p-doped polysilicon layer; annealing the p-doped polysilicon layer to activate the dopants; forming a first metal layer on the p-doped polysilicon layer; forming a layer of variable-resistance material on the first metal layer; forming a second metal layer on the layer of variable-resistance material; patterning a stack of the p-doped polysilicon layer, the first metal layer, the layer of variable-resistance material and the second metal layer to separate a plurality of resistive random access memory devices.

According to another aspect of the present disclosure, there is provided a method for operating the above resistive random access memory device, wherein the p-doped semiconductor layer of the Schottky diode is coupled to a bit line, and the other of the two electrodes of the resistive switching memory element is coupled to a word line, during read operation, a negative voltage $V_{read}$ is applied to the resistive switching memory element between the word line and the bit line;

during SET operation, a positive voltage $V_+$ is applied to the resistive switching memory element between the word line and the bit line;

during RESET operation, another negative voltage $V_-$ is applied to the resistive switching memory element between the word line and the bit line, wherein $V_{read}$, $V_+$ and $V_-$ satisfy, $$V_{SET}+V_s<V_+<V_{SET}+2V_s+V_t$$

$$V_{RESET}+V_t<V_-<V_{SET}+2V_t+V_s$$

$$V_t<V_{read}<V_{RESET}+V_t$$

where $V_{SET}$, $I_{SET}$ and $V_{RESET}$ are parameters which depend on the variable-resistance material of the resistive switching memory element, and represent a minimum voltage and a minimum current required for changing the resistive switching memory element from a high-resistance state to a low-resistance state and a minimum voltage required for changing the resistive switching memory element from the low-resistive state to the high-resistance state respectively, $V_s$ and $V_t$ represent a reverse saturation voltage and a threshold voltage of the Schottky diode respectively, and $I_s$ represents a reverse saturation current of the Schottky diode, wherein the doping concentration of the p-doped semiconductor layer of the Schottky diode is tuned so that $I_s$ satisfies $I_{SET}<I_s<2\,I_{SET}$.

The resistive random access memory device according to the present disclosure has 1D-1R configuration and operates in bipolar resistive switching scheme. It occupies a relatively small footprint of a wafer, such as $4F^2$, where F represents a feature size. Moreover, it has improved memory performances when compared with unipolar resistive random access memory devices, such as high switching speed, small RESET current, excellent uniformity of resistance and operation voltage, long data retention time and excellent endurance.

The Schottky diode in the resistive random access memory device is faster than other types of diodes, which can further increase operation speed and reliability. Moreover, the Schottky diode has current density larger than other types of diodes and can limit a current during SET operation, which can further increase endurance and reduce resistance variation.

The Schottky diode has desired value of reverse saturation current by precisely tuning doping of the semiconductor layer. Furthermore, a process for forming a Pt—Si based Schottky diode is simple and compatible to conventional semiconductor processes. Thus, the resistive random access memory device according to the present disclosure can be mass-produced.

By limiting voltages for read operation, SET and RESET operation in specific ranges, the cross-talk effect and sneak path leakages through unselected memory cells are suppressed, so that the unintended SET or RESET and mis-read are avoided. A plurality of resistive random access memory devices according to the present disclosure can be arranged an array with a high density. Each of the plurality of resistive random access memory devices is located at a cross point of a bit line and a word line as a memory cell.

DETAILED DESCRIPTION

Figure 1:
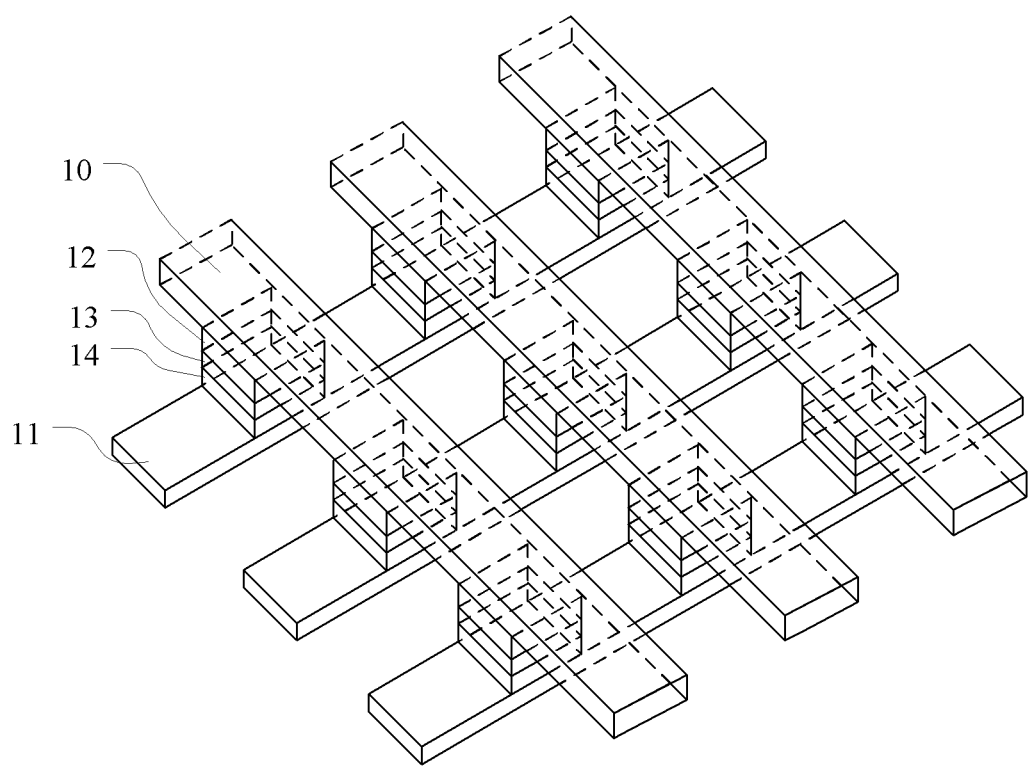
FIG. 1 schematically shows an array of resistive random access memory devices according to the present disclosure.

Exemplary embodiments of the present disclosure will be described in more details below with reference to the accompanying drawings. In the drawings, like reference numerals denote like members. The figures are not drawn to scale, for the sake of clarity.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present.

In the present application, the term "semiconductor structure" means generally the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of the semiconductor device can be made of material (s) well known to one skilled person in the art.

FIG. 1 schematically shows an array of resistive random access memory devices according to the present disclosure, including 3×3 memory cells.

The array of resistive random access memory devices comprises word lines 10 and bit lines 11, and p-doped polysilicon layer 14, a metal layer 13 (for example, Pt) and a layer 12 of variable-resistance material from bottom to top between the word lines 10 and the bit lines 11. The word lines 10 and the bit lines 11 are typically arranged to be perpendicular to each other. Each of the plurality of resistive random access memory devices is located at a cross point of a word line 10 and a bit line 11 as a memory cell.

Figure 2:
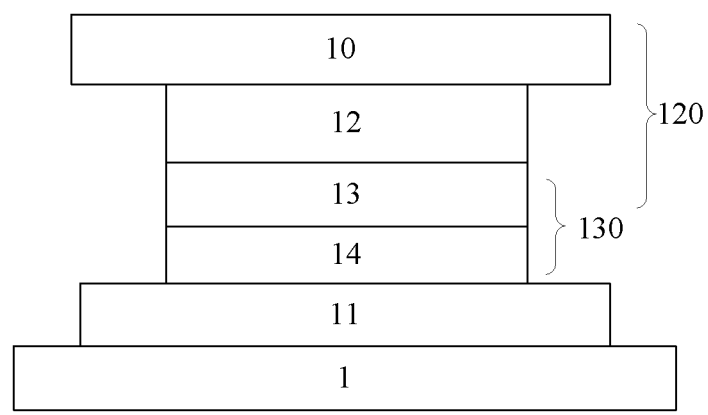
FIG. 2 schematically shows a cross section of a memory cell of the array of resistive random access memory devices shown in FIG. 1, where the memory cell is a resistive random access memory device comprising a variable-resistance memory element and a Schottky diode.

Each memory cell has 1D-1R configuration, including a resistive switching memory element and a Schottky diode which are connected with each other in series (see FIG. 2). The Schottky diode 130 comprises a p-doped polysilicon layer 14 and a metal layer 13. The resistive switching memory element 120 is located above the Schottky diode 130, and comprises a word line 10 which is also a top electrode, a layer 12 of variable-resistance material, and a metal layer 13 which is a bottom electrode.

The Schottky diode 130 and the resistive switching memory element 120 share the metal layer 13 and are connected directly with each other by the metal layer 13, which facilitates decreasing connection resistance.

Alternatively, the resistive switching memory element 120 may have a separate top electrode which is formed from a metal layer the same as that of the word line 10 in the same or different steps and in the same or different apparatus, or different from that of the word line 10 in different steps and/or in different apparatus.

Although not shown in FIGS. 1 and 2, it can be understood that an insulating material (for example, an oxide) can be formed between memory cells (i.e. around the semiconductor structure shown in FIG. 2) to isolate various resistive random access memory devices.

Figure 3:
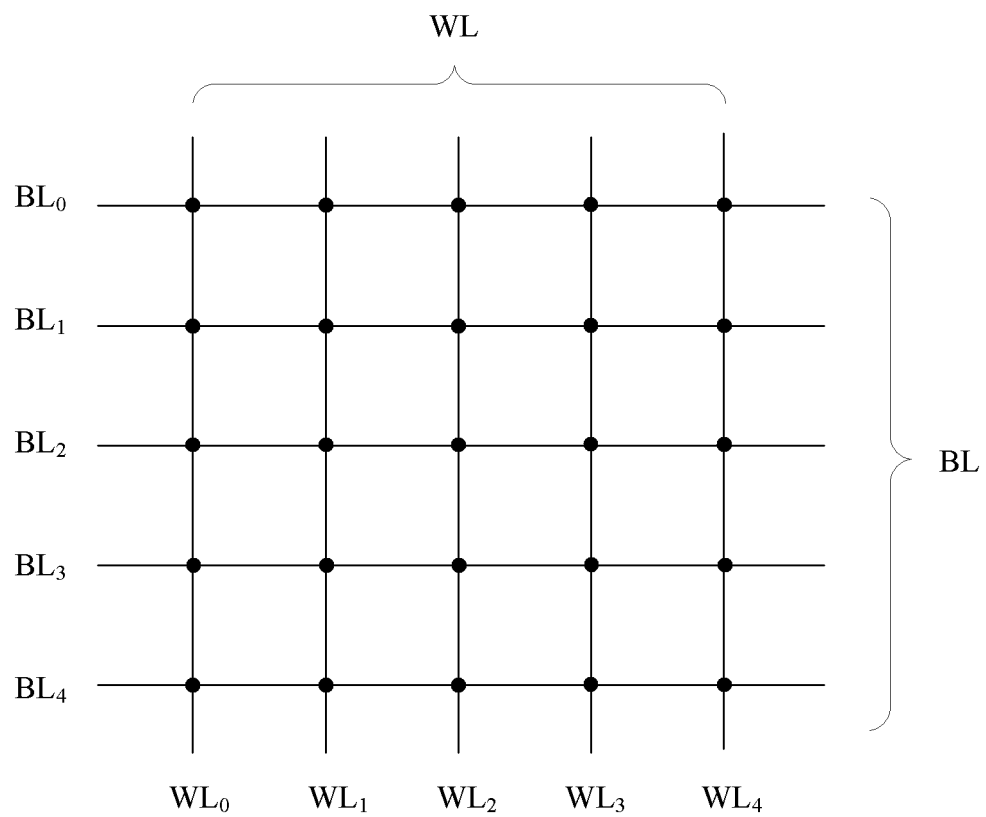
FIG. 3 schematically shows bit lines and word lines for programming/erasing the resistive random access memory devices shown in FIG. 1.

FIG. 3 schematically shows bit lines and word lines for SET/RESET the resistive random access memory devices shown in FIG. 1. When operating a memory cell, a voltage V is applied to, for example, a word line $WL_2$, a zero voltage 0 V (ground) is applied to, for example, a bit line $BL_2$, other word lines $WL_0$-$WL_1$, $WL_3$-$WL_4$ and other bit lines $BL_0$-$BL_1$, $BL_3$-$BL_4$ are floating. The memory cell at a cross point of the word line $WL_2$ and the bit line $BL_2$ is selected. Due to the diode, the memory cells at cross points of other word lines and other bit lines are disconnected from the external voltage, and are not selected.

Figure 4:
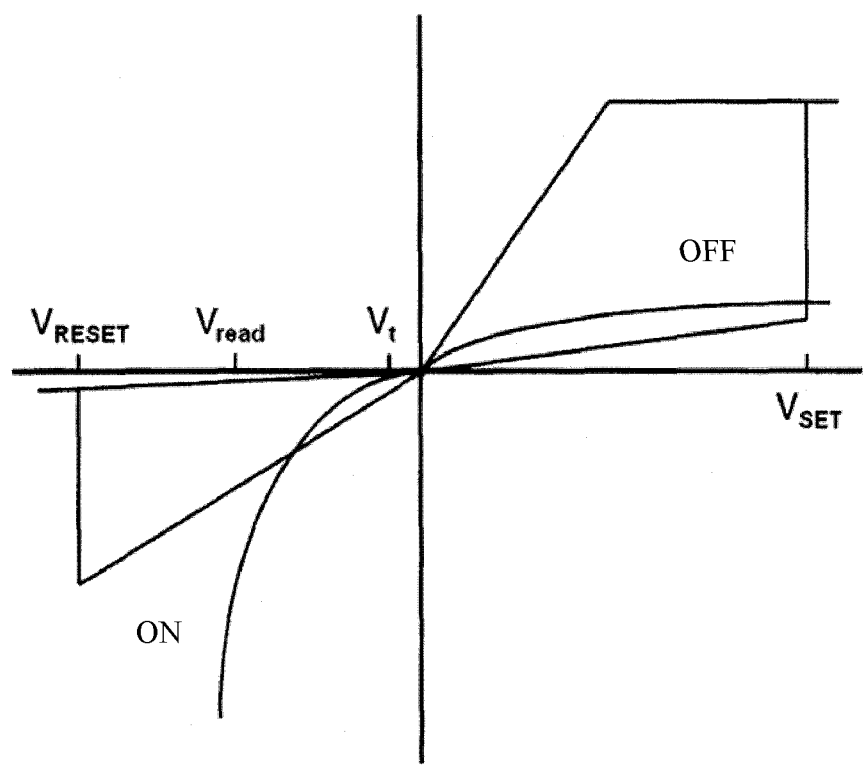
FIG. 4 is a typical I-V curve of one resistive random access memory device shown in FIG. 1.

FIG. 4 is a typical I-V curve of one resistive random access memory device shown in FIG. 1. The magnitude and the polarity of the applied voltage V determines read operation or write operating of the memory device. In the resistive random access memory device shown in FIG. 2, the Schottky diode is turned on by a negative voltage and turned off by a positive voltage.

During SET operation, the selected memory cell is changed to a low-resistance state when a voltage across the layer of variable-resistance material goes beyond $V_{SET}$. However, due to the fact that the diode is reversely biased, the external voltage actually applied to the word line is a little larger, for example, about 1.5~2 times of $V_{SET}$. Moreover, a reverse current of the Schottky diode near the external voltage $V_{SET}$ needs to be larger than a current through the resistive switching memory element when the resistive switching memory element is in a high-resistance state so as to ensure that the layer of variable-resistance material is changed from the high-resistance state to a low-resistance state. This requires that the Schottky diode provides a sufficiently reverse current.

During RESET operation, the selected memory cell is changed to a high-resistance state when a voltage across the layer of variable-resistance material goes beyond $-V_{RESET}$. Due to a small value of forward resistance of the diode, only a negative voltage slightly larger than $V_{RESET}$ is needed to be applied to the word line.

During read operation, a relatively small negative voltage, between a threshold voltage $V_t$ of the diode and $V_{RESET}$, is needed to be applied to the word line so as to ensure that original data is not destroys while the diode is turned on.

Figure 5:
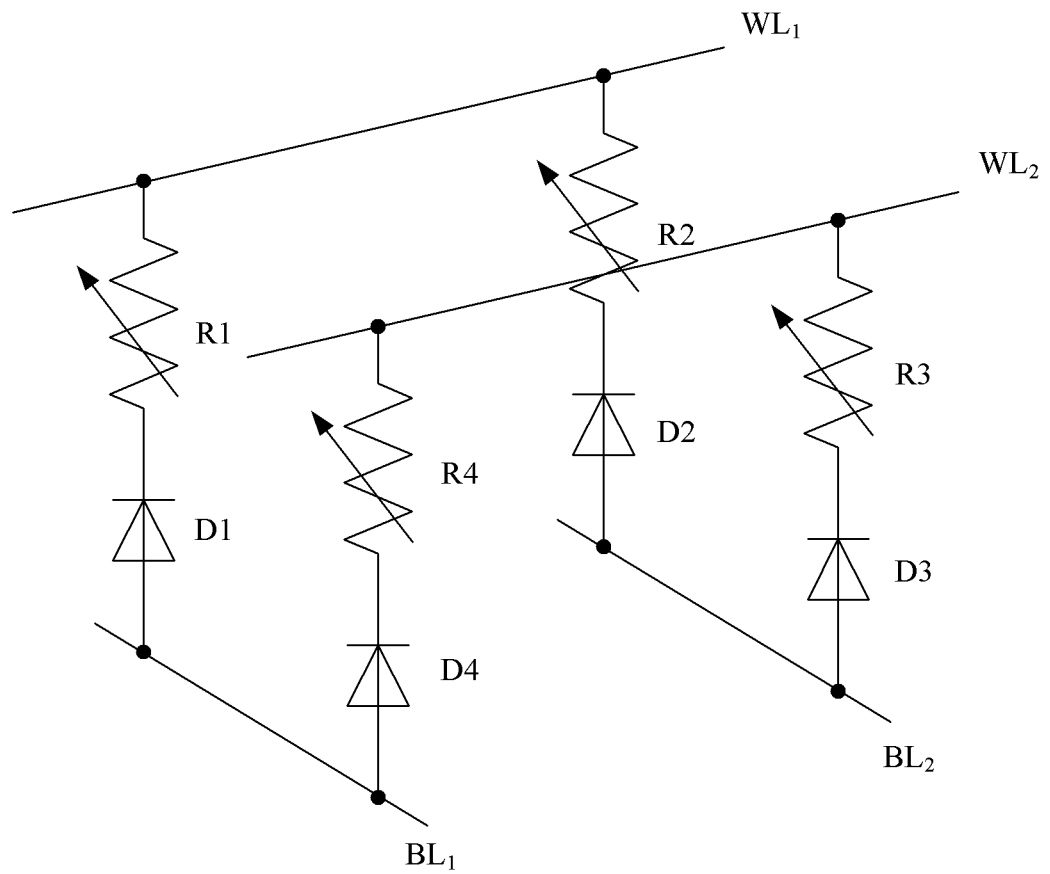
FIG. 5 is an equivalent circuit diagram of the cross-point memory array structure consisted of four resistive random access memory devices shown in FIG. 1.

FIG. 5 is an equivalent circuit diagram of the cross-point memory array structure consisted of four resistive random access memory devices shown in FIG. 1. When a memory cell is selected, other word lines and other bit lines are floating. However, there are actually other sneak paths through unselected memory cells in the array. As shown in FIG. 5, when a word line $WL_1$ and a bit line $BL_1$ are selected, a current flows through one conductive path $WL_1$-R1-D1-$BL_1$ (referred to as "selected path" hereinafter) and another conductive path $WL_1$-R2-D2-$BL_2$-D3-R3-$WL_2$-R4-D4-$BL_1$ (referred to as "sneak path" hereinafter). In most cases, due to D2, D3 and D4, the current through the sneak path has a small value and can be omitted.

However, in certain cases, the current through the sneak paths interfere with operations on the selected memory cell. To avoid interference, the current flowing through the resistive switching memory element and the Schottky diode should be limited.

During read operation, the interference occurs only in a case that R1 is in a high-resistance state and all of R2, R3 and R4 are in a low-resistance state. It requires that a reverse current of the Schottky diode near $V_{read}$ has a value much smaller than a current through the resistive switching memory element when the resistive switching memory element is in a low-resistance state, as normally achieved by a conventional Schottky diode.

During SET operation, R2 (R4) may be changed to a low-resistance state by SET operation in a case that R2 (R4) is in a high-resistance state and R3 and R4 (R2) are in a low-resistance state, while R2 (R4) is connected in series with two reversely-biased diodes D2 and D4. It requires that a reverse current of the Schottky diode have a value of the same order of the current through the resistive switching memory element when the resistive switching memory element is in a high-resistance state, and a voltage for SET operation slightly larger than a critical of the 1D1R configuration, so as to ensure that adjacent 2D1R configuration is not unintendedly programmed.

During RESET operation, R3 may be changed to a low-resistance state by SET operation in a case that R2 and R4 are in a low-resistance state and R3 is in a high-resistance state, while R3 is connected in series with a reversely-biased diode D3. It requires that a voltage for RESET operation either has a value smaller than a voltage for SET operation, or has a value larger than the voltage for SET operation but smaller than a sum of the voltage for SET operation and threshold voltages of the two diodes.

In view of the above, the reverse current of the Schottky diode should be carefully designed to have a value sufficiently large for SET operation but not for turning on unselected memory cells. All suitable values of voltages and currents for operating a selected memory cell are summarized in table 1. Relevant parameters are defined in table 2.

TABLE 1

| Parameters | Requirements |
| --- | --- |
| $V_+$ | $V_{SET} + V_s < V_+ < V_{SET} + 2V_s + V_t$ |
| $V_-$ | $V_{RESET} + V_t < V_- < V_{SET} + 2V_t + V_s$ |
| $V_{read}$ | $V_t < V_{read} < V_{RESET} + V_t$ |
| $I_s$ | $I_{SET} < I_s < 2 I_{SET}$ |

TABLE 2

| Parameters | Meaning |
| --- | --- |
| $V_+$ | external positive voltage applied between a word line and a bit line for changing a resistance state of a memory cell from a high-resistance state to a low-resistance state (SET operation) |

TABLE 2-continued

| Parameters | Meaning |
| --- | --- |
| $V_-$ | external negative voltage applied between a word line and a bit line for changing a resistance state of a memory cell from a low-resistance state to a high-resistance state (RESET operation) |
| $V_{read}$ | external negative applied between a word line and a bit line for determining a resistance state of the memory cell (read operation) |
| $V_{SET}$ | a minimum voltage for changing a resistance state of the memory cell from a high-resistance state to a low-resistance state |
| $V_{RESET}$ | a minimum voltage for changing a resistance state of the memory cell from a low-resistance state to a high-resistance state |
| $I_{SET}$ | a minimum current for changing a resistance state of the memory cell from a high-resistance state to a low-resistance state, $I_{SET}$ is slightly larger than $V_{SET}/R_H$ |
| $R_L$ | a resistance value of the memory cell when it is in a low-resistance state |
| $R_H$ | a resistance value of the memory cell when it is in a high-resistance state |
| $I_s$ | a revere saturation current of the diode |
| $V_s$ | a voltage across the diode near saturation |
| $V_t$ | a threshold voltage of the diode |

An exemplary embodiment of a method for operating a resistive random access memory device according to the present disclosure includes:

during read operation, a negative voltage of about −0.5V−−1V is applied between a word line and a bit line, at which a Schottky diode has a reverse current of less than 5 uA;

during programming operation, a positive voltage of about 2V-5V is applied between the word line and the bit line, at which the Schottky diode has a reverse current of about 10-100 uA;

during read operation, a negative voltage of about −2V−−5V is applied between the word line and the bit line.

An exemplary embodiment of a method for manufacturing resistive random access memory devices arranged in an array of a plurality of memory cells according to the present disclosure includes the follow steps.

A metal layer (for example, aluminium) for bit lines is formed on a silicon substrate, for example, by physical vapor deposition (PVD). The metal layer has a thickness of about 10-100 nm. The metal layer is then formed as a plurality of bit lines 11 by pattering the metal layer into stripes. The bit lines 11 have a width and a pitch between adjacent ones, both of which depend on resolution of lithography.

The patterning process may involve following steps: a photoresist mask having a pattern therein is formed on the metal layer, by a conventional lithographical process including exposure and development steps; the exposed portions of the metal layer are removed by dry etching such as ion beam milling, plasma etching, reactive ion etching, laser ablation and the like, or wet etching using a solution of etchant, stopping on the top of the silicon substrate 1; and the photoresist mask is then removed by ashing or dissolution with a solvent.

An insulating layer (for example, silicon dioxide) is then formed on the surface of the entire semiconductor structure, for example, by chemical vapor deposition (CVD). The insulating layer has a thickness of about 20-200 nm. The semiconductor structure is then planarized by chemical mechanical polishing (CMP) with the metal layer of the bit lines 11 as a stop layer, until the top surface of the bit lines 11 is exposed.

A polysilicon layer is then formed on the entire semiconductor structure, for example, by CVD. The polysilicon layer has a thickness of about 30-500 nm. The polysilicon layer is doped with boron or boron fluoride at a certain doping concentration by ion implantation, followed by an anneal at about 600-800° C. A p-doped polysilicon layer 14 is thus formed.

As mentioned above, external voltages will be applied to the resistive random access memory device according to the present disclosure during operation in accordance with requirements listed in table 1. Thus, a voltage for changing a resistance state of a resistive switching memory element and a reverse current of a Schottky diode should be carefully limited to a range.

By tuning a doping concentration of the p-doped polysilicon layer 14 of the Schottky diode 130 in the above ion implantation, a forward current and a reverse current of the Schottky diode 130 can have suitable values.

Preferably, the doping concentration of boron in the p-doped polysilicon layer 14 may be in the range of about $10^{13} \sim 10^{18}/cm^3$.

A metal layer 13 (for example, Pt) is then formed on the entire semiconductor structure, for example, by PVD. The metal layer 13 has a thickness of about 10-100 nm. The Schottky diode 130 comprises the p-doped polysilicon layer 14 and the metal layer 13. The metal layer 13 is also used as a bottom electrode of a resistive switching memory element to be formed. A layer 12 of variable-resistance material (for example, $HfO_2$) is then formed on the surface of the entire semiconductor structure by the above conventional deposition process. The layer 12 of variable-resistance material has a thickness of about 5-50 nm.

The p-doped polysilicon layer 14, the metal layer 13 and the layer 12 of variable-resistance material are then patterned to a plurality of separate stacks of square or circle shape. Each stack (for example, of square shape) will be a memory cell. The stacks of square shape are aligned to the bit lines, and typically have a width and a pitch between adjacent ones the same as those of the bit lines.

An insulating layer (for example, silicon dioxide) is then formed on the entire semiconductor structure, for example, by CVD. The insulating layer has a thickness of about 50-800 nm. The semiconductor structure is then planarized by CMP until the top surface of the layer 12 of variable-resistance material is exposed.

A metal layer (for example, Pt or TiN) is then formed for word lines on the entire semiconductor structure, for example, by PVD. The metal layer has a thickness of about 10-100 nm. The metal layer is then formed as a plurality of word lines 10 by pattering the metal layer into stripes. The word lines are perpendicular to the bit lines and have a width and a pitch between adjacent ones the same as those of the bit lines.

The word lines 10 are also used as a top electrode of the resistive switching memory element 120.

Alternatively, the resistive switching memory element 120 may have a separate top electrode which is formed from a metal layer the same as that of the word line 10 in the same or different steps and in the same or different apparatus, or different from that of the word line 10 in different steps and/or in different apparatus.

An insulating layer (for example, silicon dioxide) is then formed on the entire semiconductor structure, for example, by CVD. The insulating layer has a thickness of at least about 150 nm and is used as isolation between a memory cell and other memory cells or other components of the memory.

Subsequent steps for forming wirings, for passivation, or for other purposes may be continued to complete the structure of the resistive random access memory device according to the present disclosure. These subsequent steps are well known by one skilled person.

While the disclosure has been described with reference to specific embodiments, the description is illustrative of the disclosure. The description is not to be considered as limiting the disclosure. Various modifications and applications may occur for those skilled in the art without departing from the true spirit and scope of the disclosure as defined by the appended claims.

We claim:

1. A method for operating a resistive random access memory device the resistive random access memory device comprising: a resistive switching memory element including two electrodes and a layer of variable-resistance material between the two electrodes, wherein the layer of variable-resistance material exhibits bipoarl resitive switching behavior, and a Schottky diode including a metal layer and a p-domed semiconductor layer which contact each other, wherein the Schottky diode and the resistive switching memory element share the metal layer and are connected directly with each other by the shared metal layer, wherein the p-doped semiconductor layer of the Schottky diode is coupled to a bit line, and the other of the two electrodes of the resistive switching memory element is coupled to a word line, the method comprising:

during read operation, a negeative voltage $V_{read}$ is applied to the resistive switching memory element between the word line and the bit line;

during SET operation, a positive voltage $V_+$ is applied to the resistive switching memory element between the word line and the bit line; and during RESET operation, another negative voltage $V_-$ is applied to the resistive switching memory element between the word line and bit line, wherein $V_{read}$, $V_+$ and $V_-$ satisfy, $$V_{SET}+V_s<V_+<V_{SET}+2V_s+V_t \quad 1.$$

$$V_{RESET}+V_t<V_-<V_{SET}+2V_t+V_s \quad 2.$$

$$V_t<V_{read}<V_{RESET}+V_t \quad 3.$$

where $V_{SET}$, $I_{SET}$ and $V_{RESET}$ are parameters which depend on the variable-resistance material of the resistive switching memory element, and represent a minimum voltage and a minimum current required for changing the resistive switching memory element from a high-resistance state to a low-resistance state and a minimum voltage required for changing the resistive switching memory element from the low-resistive state to the high-resistance state respectively, $V_s$ and $V_t$ represent a reverse saturation voltage and a threshold voltage of the Schottky diode respectively, and $I_s$ represents a reverse saturation current of the Schottky diode, wherein the doping concentration of the p-doped semiconductor layer layer of the Schottky diode is tuned so that $I_s$ satisfies $I_{SET}<I_s<2\ I_{SET}$.

2. The resistive random access memory device according to claim 1, wherein the p-doped semiconductor layer of the Schottky diode is a p-doped polysilicon layer.

3. The method according to claim 1, wherein the p-doped semiconductor layer layer of the Schottky diode is a p-doped polysilicon layer which has a doping concentration of about $10^{13} \sim 10^{18}/cm^3$ so that the reverse saturation current $I_s$ of the Schottky diode is about 10-100 uA.

4. The method according to claim 3, wherein during read operation, the negative voltage of about −0.5V--1V is applied to the resistive switching memory element between the word line and the bit line;

during SET operation, the positive voltage of about 2V-5V is applied to the resistive switching memory element between the word line and the bit line; and during RESET operation, the negative voltage of about −2V--5V is applied to the resistive switching memory element between the word line and the bit line.

* * * * *